(12) United States Patent
Dusanapudi et al.

(10) Patent No.: US 9,910,941 B2
(45) Date of Patent: *Mar. 6, 2018

(54) TEST CASE GENERATION

(71) Applicant: INTERNATIONAL BUSINESS MACHINES CORPORATION, Armonk, NY (US)

(72) Inventors: Manoj Dusanapudi, Bangalore (IN); Madhusudan Kadiyala, Bangalore (IN); John Paul, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/382,984

(22) Filed: Dec. 19, 2016

(65) Prior Publication Data

US 2017/0177765 A1    Jun. 22, 2017

Related U.S. Application Data

(63) Continuation of application No. 15/234,603, filed on Aug. 11, 2016, now Pat. No. 9,594,672, which is a
(Continued)

(51) Int. Cl.
*G06F 9/455* (2006.01)
*G06F 17/50* (2006.01)
(Continued)

(52) U.S. Cl.
CPC .... *G06F 17/5009* (2013.01); *G06F 17/30345* (2013.01); *G06N 99/005* (2013.01)

(58) Field of Classification Search
USPC ........................................................ 716/106
See application file for complete search history.

(56) References Cited

U.S. PATENT DOCUMENTS 7,467,364 B2   12/2008   Hekmatpour
7,533,294 B2    5/2009   Mishra et al.
(Continued)

OTHER PUBLICATIONS

Fine et al., "Harnessing Machine Learning to Improve the Success Rate of Stimuli Generation", in IEEE Transactions on Computers, vol. 55, No. 11, Nov. 2006, pp. 1344-1355.
(Continued)

*Primary Examiner* — Eric Lee
(74) *Attorney, Agent, or Firm* — Brian M. Restauro

(57) ABSTRACT

Embodiments of the present invention provide methods, computer program products, and systems for generating comprehensive test cases covering new events yet to be covered. Embodiments of the present invention can be used to receive a request to generate a test case, wherein the request comprises a coverage schema associated with a first set of events to be covered in the generated test case. Embodiments of the present invention includes updating the coverage schema, wherein the updating the coverage schema comprises adding a second set of events to be covered in the generated test case and generating constraints used to satisfy requirements for meeting the first set of events and the second set of events in the updated coverage schema. Embodiments of the present invention can generate a test case using the generated constraints and the updated coverage schema.

1 Claim, 5 Drawing Sheets

Related U.S. Application Data continuation of application No. 15/010,799, filed on Jan. 29, 2016, now Pat. No. 9,514,036, which is a continuation of application No. 14/971,300, filed on Dec. 16, 2015.

(51) Int. Cl.
*G06F 17/30* (2006.01)
*G06N 99/00* (2010.01)

(56) References Cited

U.S. PATENT DOCUMENTS

| | | | |
|---|---|---|---|
| 7,603,334 | B2 | 10/2009 | Beloesch |
| 7,636,871 | B1 | 12/2009 | Blue et al. |
| 7,865,853 | B2 | 1/2011 | Hekmatpour et al. |
| 8,280,713 | B2 | 10/2012 | Adir et al. |
| 8,495,570 | B2 | 7/2013 | Fortune et al. |
| 8,826,202 | B1 | 9/2014 | Goel et al. |
| 9,021,434 | B2 | 4/2015 | Fortune et al. |
| 9,514,036 | B1 | 12/2016 | Dusanapudi et al. |
| 2007/0266349 | A1* | 11/2007 | Craig ............... G01R 31/31838 716/106 |
| 2012/0084538 | A1 | 4/2012 | Alapati et al. |
| 2012/0226952 | A1 | 9/2012 | Katz et al. |
| 2014/0101628 | A1* | 4/2014 | Almog ................ G06F 11/2236 716/107 |

OTHER PUBLICATIONS

Hekmatpour et al., "Block-based Schema-driven Assertion Generation for Functional Verification", Proceedings of the 14th Asian Test Symposium (ATS '05), © 2005 IEEE, 6 pages.

Hekmatfour et al., "Database Analysis and Data Mining Methods to improve the Quality and Efficiency of Coverage-Driven Functional Verification", Proceedings of Global Signal Processing Expo and Conference, GSPX 2004, Jun. 10, 2004, <www.amir.com/docs/gspx04_1120.pdf>.

Koo et al., "Coverage-driven Functional Test Generation for Processor Validation using Formal Methods", US-Korea Conference on Science, Technology, and Entrepreneurship (UKC), New Jersey, Aug. 10-13, 2006, 7 pages, <http://esl.cise.ufl.edu/publications>.

Koo et al., "Coverage-Driven Test Generation for Functional Validation of Pipelined Processors", Ph.D, Dissertation University of Florida, Dec. 2008 <http://esi.cise.ufl.edu/publications>.

Mishra et al., "Functional Coverage Driven Test Generation for Validation of Pipelined Processors", Proceedings of the Design, Automation and Test in Europe Conference and Exhibition (Date'05), vol. 2, pp. 678-683, IEEE Computed Society Washington, DC, USA, © 2005, <http://dl.acm.org/citation.cfm?id=1049195&CFID=544125856&CFTOKEN=73961876>.

Wang, Li-C, "Data Mining in Functional Test Content Optimization", Design Automation Conference (ASP-DAC), 2015 20th Asia and South Pacific, Jan. 19-22, 2015, pp. 308-315, <http://ieeexplore.ieee.org/xpl/articleDetails.jsp?arnumber=7059023&newsearch=true&queryText=data%20minding%20in%20functional%20test%20content%20optimization>.

Wile et al., "Advanced Verification Techniques", Chapter 14, Figure 14.11, p. 598; in "Comprehensive Functional Verification: The Complete Industry Cycle", Elsevier, May 26, 2005, <https://books.google.co.in/books?id=btl_OX3kJ7MC&pg=PA598&lpg=PA598&dq=coverage+feedback+machine+learning+wile+roesner&source=bl&ots=zURGKhc_S7&sig=aFmb3ei8exPADRf-B7tV2Ts9gsal&hl=en&sa=X&ei=2zD4VKLgGtff8AWbgYAg&ved=0CCAQ6AEwAA#v=onepage&q=coverage%20feedback%20machine%20learning%20wile%20roesner&f=false>.

"Unified Coverage Interoperability Standard (UCIS)", Accellera Systems Initiative, Version 1.0, Jun. 2, 2012, Copyright © 2012 Accellera Systems Initiative Inc., Napa, CA, pp. 1-362, <http://www.accellera.org/downloads/standards/ucis>.

U.S. Appl. No. 14/971,300 entitled "Test Case Generation" filed Dec. 16, 2015.

U.S. Appl. No. 15/234,603 entitled "Test Case Generation" filed Aug. 11, 2016.

IBM Appendix P.: "List of IBM Patents or Patent Applications Treated as Related", Dated Dec. 19, 2016, 2 pages.

* cited by examiner

TEST CASE GENERATION

BACKGROUND

The present invention relates generally to test case generation, and more specifically to designing test case generation schemas.

Typically, hardware functional verification is performed to demonstrate functionality and ensure quality of a hardware design. Different coverage metrics are typically defined to assess that the design has been adequately tested to ensure reliability. One metric typically used is a functional coverage metric.

Generally, functional coverage metrics include determining what functionality needs are covered, writing tests to exercise that functionality, collecting data with respect to that functionality, and analyzing the data collected.

SUMMARY

Embodiments of the present invention provide methods, computer program products, and systems for generating comprehensive test cases covering new events yet to be covered. In one embodiment, a method is provided comprising: receiving a request to generate a test case, wherein the request comprises a coverage schema associated with a first set of events to be covered in the generated test case; updating the coverage schema, wherein updating the coverage schema comprises adding a second set of events to be covered in the generated test case; generating constraints used to satisfy requirements for meeting the first and the second set of events in the updated coverage schema; and generating a test case using the generated constraints and the updated schema.

DETAILED DESCRIPTION

Embodiments of the present invention recognize that defining function coverage metrics in test case generation is a complex task. In some instances, user-defined events may not cover the complete cover space. For example, a user may specify a few events but may miss certain combinations of events that could reveal bugs in the design. Embodiments of the present invention provide solutions for generating comprehensive test cases covering new events yet to be covered. In this manner, as discussed in greater detail later in this specification, embodiments of the present invention can generate test cases for faster and comprehensive test case designs.

Figure 1:
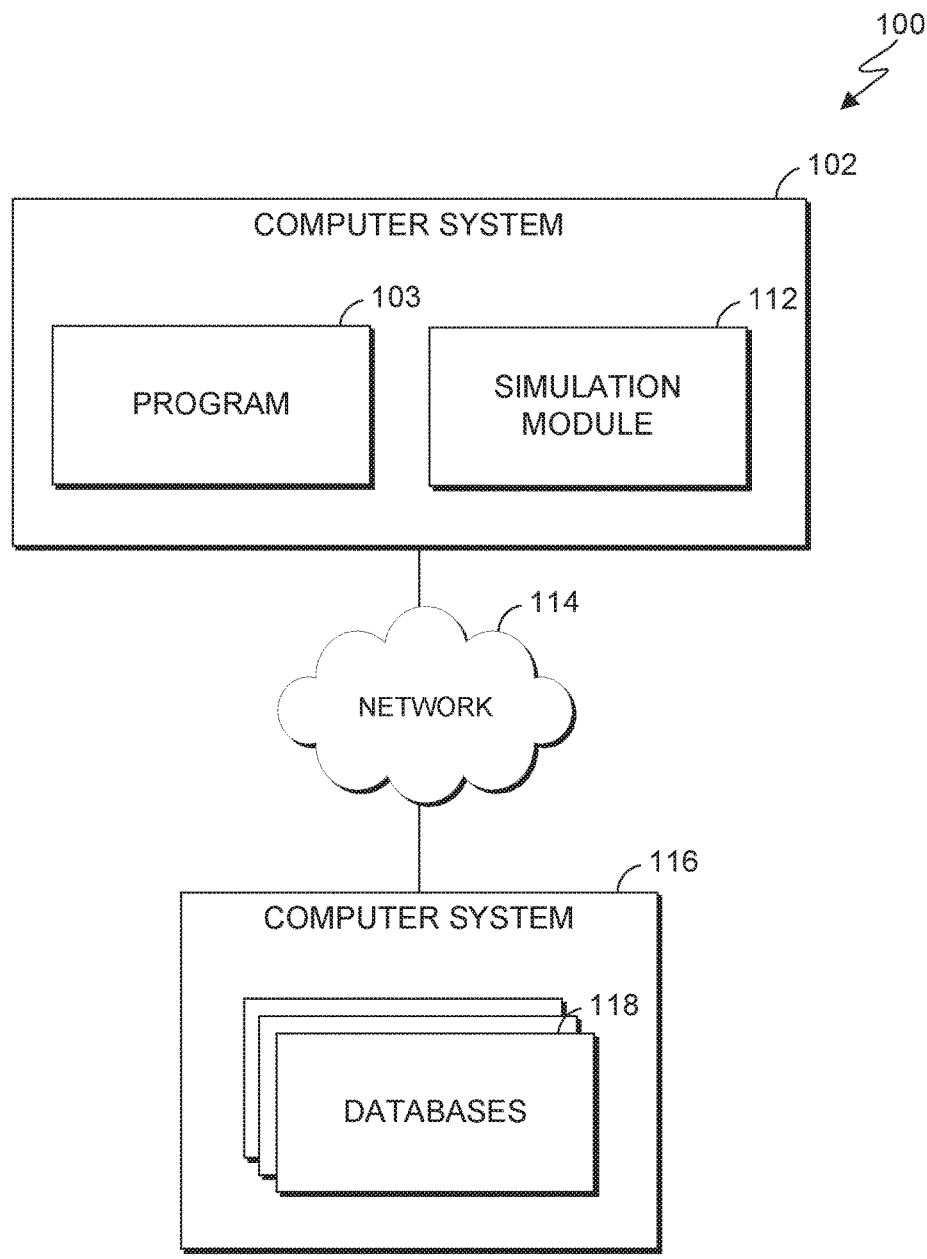
FIG. 1 is a block diagram of a computing environment, in accordance with an embodiment of the present invention.

FIG. 1 is a functional block diagram of computing environment 100, in accordance with an embodiment of the present invention. Computing environment 100 includes computer system 102 and computer system 116. Computer system 102 and computer system 116 can be desktop computers, laptop computers, specialized computer servers, or any other computer systems known in the art. In certain embodiments, computer system 102 and computer system 116 represent computer systems utilizing clustered computers and components to act as a single pool of seamless resources when accessed through network 114. For example, such embodiments may be used in data center, cloud computing, storage area network (SAN), and network attached storage (NAS) applications. In certain embodiments, computer system 102 and computer system 116 represent virtual machines. In general, computer system 102 and computer system 116 are representative of any electronic devices, or combination of electronic devices, capable of executing machine-readable program instructions, as described in greater detail with regard to FIG. 5.

Figure 2:
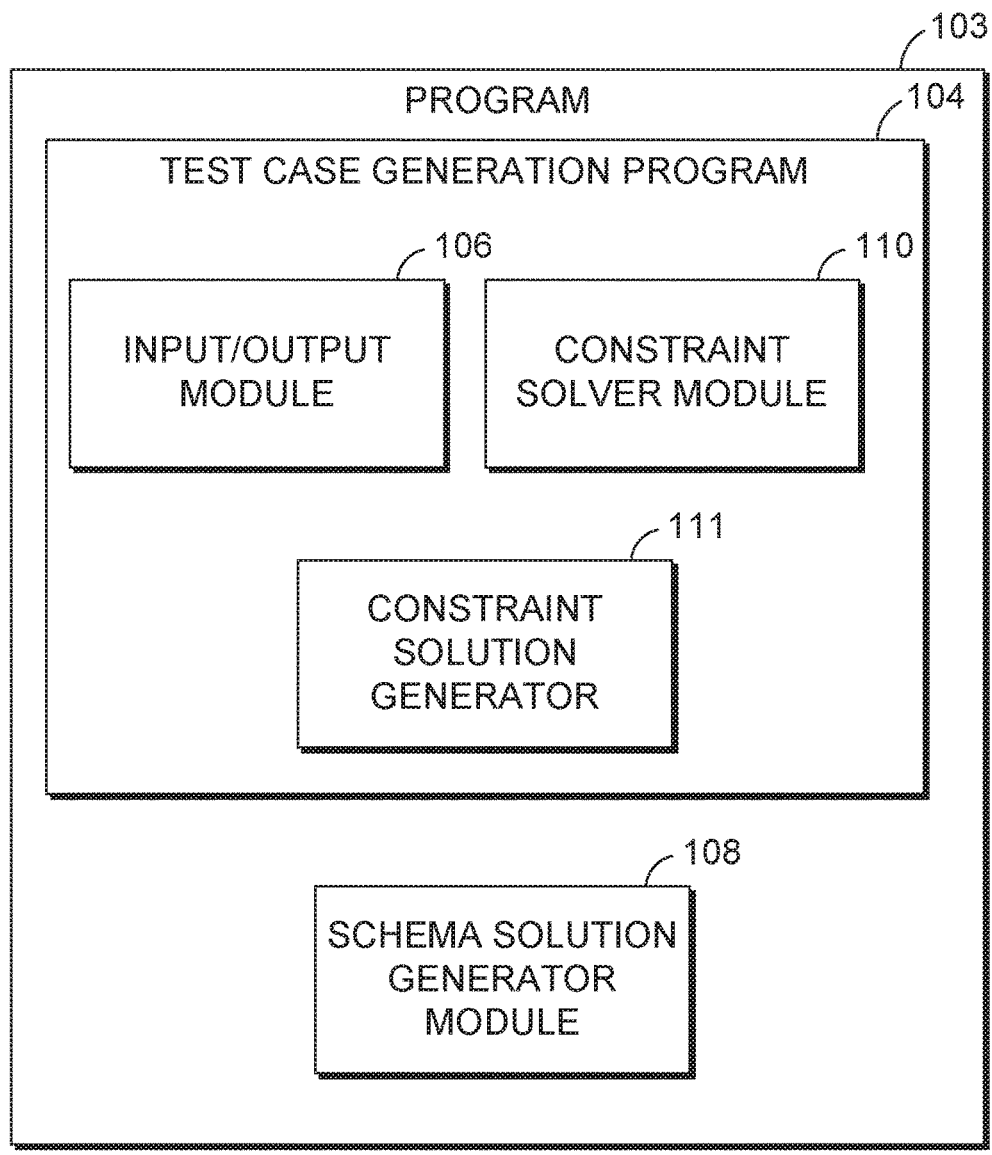
FIG. 2 is a block diagram showing machine logic (for example, software) portion of an embodiment of the present invention.

Computer system 102 includes program 103 and simulation module 112. Program 103 is responsible for generating test case solutions, generating schemas, and transmitting the generated test case solutions to simulation module 112 for testing, as described in greater detail with regard to FIG. 2. For example, responsive to receiving an input, program 103 can interact with computer system 116 via network 114 to access databases 118. As shown in FIG. 2, program 103 includes test case generation program 104 and schema solution generator module 108. Test case generation program 104 includes input/output module 106, constraint solver module 110, and constraint solution generator module 111 as shown and described in greater detail in FIG. 2.

In this embodiment, an "input" can be a request to generate a test case. A "test case", as used herein, refers to a set of conditions under which a tester will determine whether the device under verification is working as intended. An input can include coverage schema (i.e., a specification that defines a combination of events to be covered). The coverage schema is functionally equivalent to a checklist of events that need to be covered during a simulation of generated test case and can be referred to as a "coverage database". An "event" is an instance in the coverage metrics. Test parameters can be derived from the specification for the coverage metric. An example schema and event is described below:

Schema 1
=>{Instruction, Addressing Mode}
wherein "Instruction" represents all valid instructions supported by the hardware and "AddressingMode" is the intersection of all valid addressing modes supported by the design for which the address mode instruction is supported.
Event 1
=>{ADD, 32-bit}
wherein "ADD" is an instruction to execute in Addressing Mode and "32-bit" is a variable with which to execute the addressing mode. In other words, Event 1 specifies that the instruction "ADD" should be executed in 32 bit mode.

Simulation module 112 receives generated test case solutions from program 103 (e.g., constraint solver module 110) and tests the generated solution. In this embodiment, simulation module 112 tests generate a test case solution by running the generated test case on a simulated hardware module to test the functional correctness of the device under verification (DUV). The generated test case verifies the functional correctness of the device being tested and can be measured regarding the following two aspects: (i) whether the test case contains the expected event, which is measured at the end of simulation and cross checking with events in the updated schema and (ii) expected results in the test case are derived from architectural knowledge and correct checking of the simulation output with reference module output.

Simulation module 112 also generates a report and analyzes the generated test cases to verify the required event is generated. Accordingly, simulation module 112 can update the coverage database with events covered during simulation.

Computer system 116 includes databases 118. Databases 118 store constraint templates, store constraint libraries, and maintain the coverage database. In general, databases 118 can be implemented with any storage architecture known in the art.

The term "constraint library", as used herein, refers to a set of constraints that can be used in generating a solution to a received request. A "constraint" is a variable to which the generated test case (i.e., solution) should adhere. Example constraints are reproduced below:
Constraint 1: A restriction to register/memory
Contents of [General Purpose Register]=0x0
Constraint 2: A restriction on the outcome of an operation
ExceptionOccurred=FALSE The term "constraint templates", as used herein are one or more base layers on which constraints are layered to in order to generate a solution for a given event. An example constraint template is reproduced below:
Constraint Template 1
<TestCase>
<ExceptionOccurred=False/>
<AddressTranslation=True/>
<Addressing Mode=64 bit/>
<MAcroCall name="AutomaticGeneration">
</TestCase>

For illustrative purposes, the following discussion is made with respect to databases 118 residing on computer 116. However, it should be understood that databases 118 can reside on the same computer system (e.g., computer system 102) as test case generation program 104. In other embodiments, databases 118 may be included as a component of test case generation program 104.

Network 114 can be, for example, a local area network (LAN), a wide area network (WAN) such as the Internet, or a combination of the two, and include wired, wireless, or fiber optic connections. In general, network 114 can be any combination of connections and protocols that will support communications between computer system 102 and computer system 116, in accordance with a desired embodiment of the invention.

FIG. 2 is a block diagram showing machine logic (for example, software) portion of an embodiment of the present invention. For example, FIG. 2 shows a block diagram of test program 103.

Program 103 includes schema solution generator module 108 and test case generation program 104. Schema solution generator module 108 generates new schemas using different machine-learning techniques which provide new events to be covered in the generated test case and improve the coverage metric. Schema solution generator module 108 can then transmit its output (e.g., the generated schemas) to constraint solution generator module 111. An example received input having coverage schema 1 and 2 is reproduced below:

Example 1

Schema1=>{Instruction, Addressing Mode}
Schema2=>{Instruction, Exception}
wherein, Schema 1 and 2 provide logic to determine if a given instruction was executed in a particular Addressing Mode and logic to determine if a given instruction took a particular exception.

In Example 1, a user cannot determine if the instruction took the particular exception in the particular Addressing Mode. However, schema solution generator module 108 can generate a new schema that can determine that the instruction took the particular exception in the particular Addressing Mode. Schema solution generator module 108 can generate a new schema by taking the cross product of Schema 1 and Schema 2 to yield Schema 3, reproduced below:
Schema3=>{Instruction, Addressing Mode, Exception}

In other examples, schema solution generator module 108 can generate the required event by a union, intersection, taking a cross-product of two schemas, etc. Examples of a union and intersection are described below:

Example 2

Schema5=>{Instruction, Exception_XYZ}
Scheme6=>{Exception XYZ, Operand_A_Out_of_Range}
Schema7=>{Exception XYZ, Operand_B_Zero}
wherein, schema solution generator module 108 generates constraints based on Schema 6 and Schema 7 to generate a scenario to cover Schema 5.

Test case generation program 104 generates test case solutions based, at least in part, on the received input and databases. Test case generation program 104 includes input/output module 106, constraint solver module 110 and constraint solution generator module 111.

Input/output module 106 receives one or more inputs and/or requests for a test case and transmits output (e.g., generated test cases) to computer system 102. In this embodiment, input/output module 106 can receive inputs from computer system 102. In other embodiments, input/output module 106 can receive inputs and transmit outputs from one or more other components of computing environment 100.

Constraint solution generator module 111 is responsible for generating a constraint solution for the received input. The term "constraint solution", as used herein, refers to a set of constraints represented in a format that is recognized by a constraint solver (e.g., constraint solver 110). In this embodiment, constraint solution generator module 111 receives as its input, schemas generated by schema solution generator module 108. In this embodiment, constraint solution generator module 111 generates a constraint solution for the received schema by accessing databases 118 (e.g., the constraint library, constraint templates, coverage databases, and coverage schema). For example, constraint solution generator module 111 generates the test case solution by mapping received input schema to relevant predefined constraint libraries and constraint templates to generate the required event, as discussed in greater detail with regard to FIGS. 2 and 3. Accordingly, constraint solution generator module 111 can transmit its output (e.g., the generated constraint solution) to constraint solver module 110.

Constraint solver module 110 generates a test case which is defined in terms of constraints (i.e., properties to which the test case should adhere) received from constraint solution generator module 111. In other words, constraint solver module 110 generates a test case using the output of constraint solution generator module 111. Accordingly, constraint solver module 110 ensures that the constraints as defined by the constraint solution generator module 111 are satisfied in the generated test case. Constraint solver module 110 can then transmit the generated test case to simulation module 112.

Figure 3:
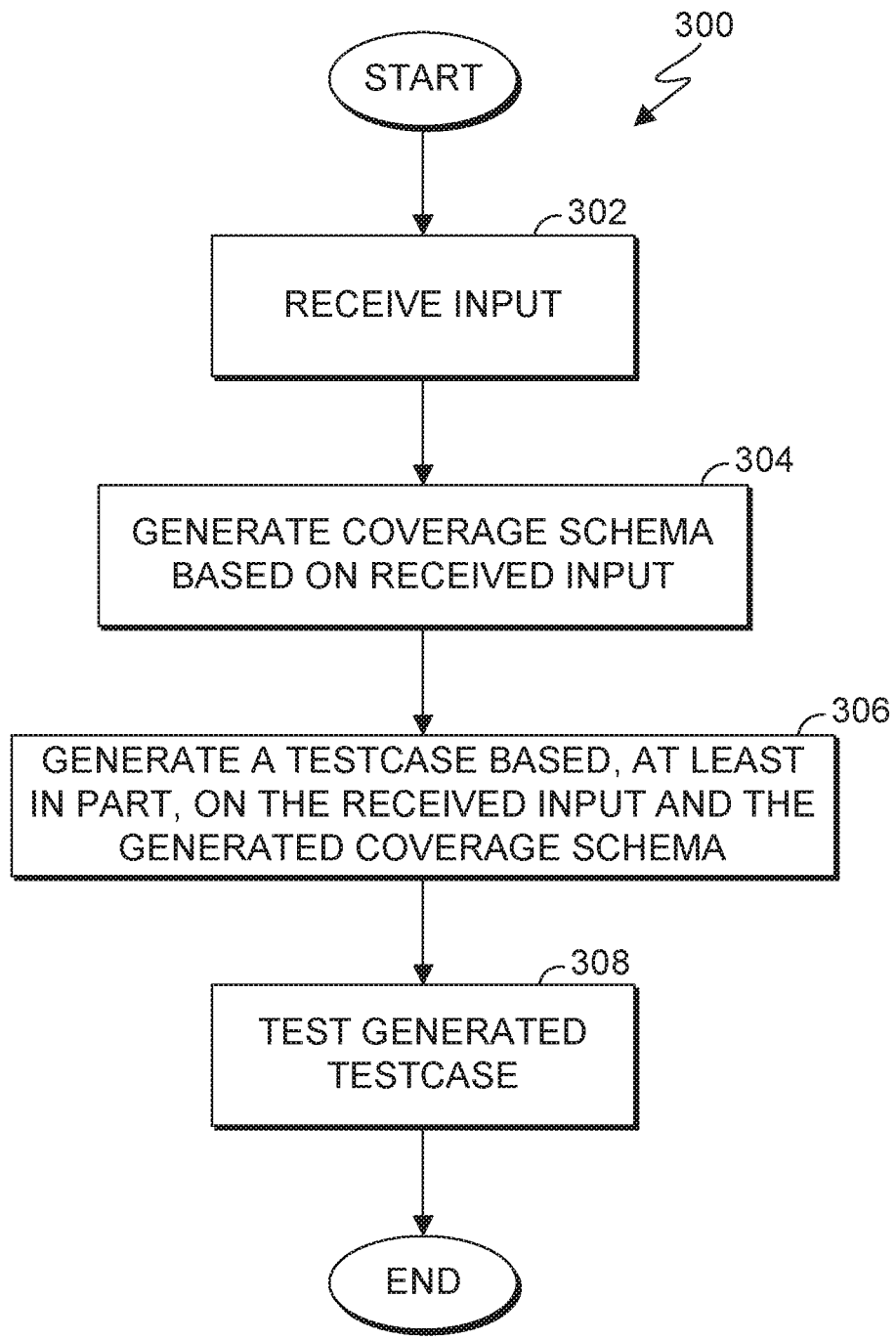
FIG. 3 is a flowchart illustrating operational steps for generating a test case solution, in accordance with an embodiment of the present invention.

FIG. 3 is a flowchart 300 illustrating operational steps for generating a test case solution, in accordance with an embodiment of the present invention.

In step 302, input/output module 106 receives input from computer system 102. In this embodiment, a user can transmit input to input/output module 106. In other embodiments, input/output module 106 can receive inputs from one or more other components of computing environment 100. As mentioned previously, an "input" can be a request to generate a test case. An input can include coverage schema (i.e., a specification that defines a combination of events to be covered). The coverage schema can be used as a coverage database which is functionally equivalent to a checklist of events that need to be covered during a simulation of a generated test case.

For example, input/output module 106 can receive an input to generate a test case to make sure the design under test handles all the "Addressing Modes" and the "exceptions" correctly. The received input can be the specified schema, reflected by the following Schema8 and Schema9:
Schema8: {Instruction, Addressing Mode}
wherein Schema8 has the following events:
Event2: {A to Z}, Addressing Mode {32 bit, 64 bit}
wherein "A-Z" represent numeric variables (e.g., 26) and "32 bit and 64 bit" represents 2 numeric variables; and where the total events for Schema8 are the product of the two variables (e.g., 26*2). In other words, there are 52 events to be covered in Schema 8.
Schema9: {Instruction, exceptionType}
wherein, Schema9 can have ten exception types and can have the following events:
Event3: {A to Z}*{1-10}
wherein, Event3 associated with Schema9 can have 260 events (e.g., 26*10).

Therefore, in this example, the coverage schema (also referred to as coverage database) can have 52+260 events. In some embodiments, the user-specified coverage schema do not or fail to address unforeseen events that would be helpful in testing the device under verification. For example, continuing the above example, the coverage schema, as given, cannot establish if "Instruction A took an exceptionType=1 while executing in 32-bit mode". Program 103 can generate a test case solution to ensure that scenario is covered and discover any potential bugs with the design under verification.

In step 304, schema solution generator module 108 generates coverage schema based on the received input. In this embodiment, schema solution generator module 108 can generate coverage schema using different machine-learning techniques, which provides new events to be covered in the generated test case, as described in greater detail with regard to FIG. 4. Continuing the example above, schema solution generator module 108 can generate a new schema by combining the received schema and events as reproduced below:
Schema10: {Instruction, Addressing Mode, ExceptionType}
Events3: {A-Z}*{32 bit, 64 bit}*{1-10}
wherein, event 3 has 520 events (e.g., the product of 26*2*10)

Accordingly, schema solution generator module 108 can transmit its output (e.g., updated coverage schema) to constraint solution generator module 111.

In step 306, constraint solver module 110 generates a test case based, at least in part, on the received input and the generated coverage schema. In other words, constraint solver module 110 generates a test case that agrees with the constraint solution (e.g., the output of constraint solution generator module 111). In this embodiment, constraint solver module 110 generates a test case that agrees with the constraint solution by verifying that all constraints are satisfied in the test case. Accordingly, constraint solver module 110 transmits its output (that is, the generated test case) to simulation module 112.

In instances where constraint solver module 110 cannot generate a solution satisfying all the constraints specified in the request, constraint solver module 110 can report a runtime failure and transmit feedback to databases 118. In this embodiment, constraint solver module 110 can transmit the set of constraints causing the failure. A "failure", in this embodiment, could indicate an error within constraint solver module 110 or due to an architectural non-compliance which would require modification to a reference model of constraint solver module 110. Where a set of constraints has been transmitted to databases 118, a learning interface of the constraint library can apply machine-learning algorithms to improve the constraint library.

In step 308, simulation module 112 tests the generated solution. In this embodiment, simulation module 112 tests the generated solution by measuring the correctness of in the following two ways: (i) whether the test case contains the expected event, which is measured at the end of simulation and cross checking with events in the updated schema and (ii) expected results in the test case are derived from architectural knowledge and correct checking of the simulation output with reference module output.

In this embodiment, simulation module 112 generates a test report that verifies whether the generated solution mimics the parameters of the received input (e.g., the requested coverage schema). In this embodiment, the test report includes all events that are assessed when the test case is run on hardware. For example, the test report can have a list of all the events that were covered (i.e., events that were present and tested) as well as those that were uncovered (i.e., those events that were not able to be reproduced and/or failed the test).

In this embodiment, where a generated test case fails the test, simulation module 112 can transmit a notification to schema solution generator module 108. Accordingly, in response to receiving the notification, a user of test case generation program 104 can analyze the test report.

Where a generated test case passes the test, simulation module 112 can transmit a notification to schema solution generator module of the results. Accordingly, schema solution generator module 108 can update databases 118. Specifically, schema solution generator module 108 can update the constraint library, constraint templates, and coverage list to include the generated test case solution.

Figure 4:
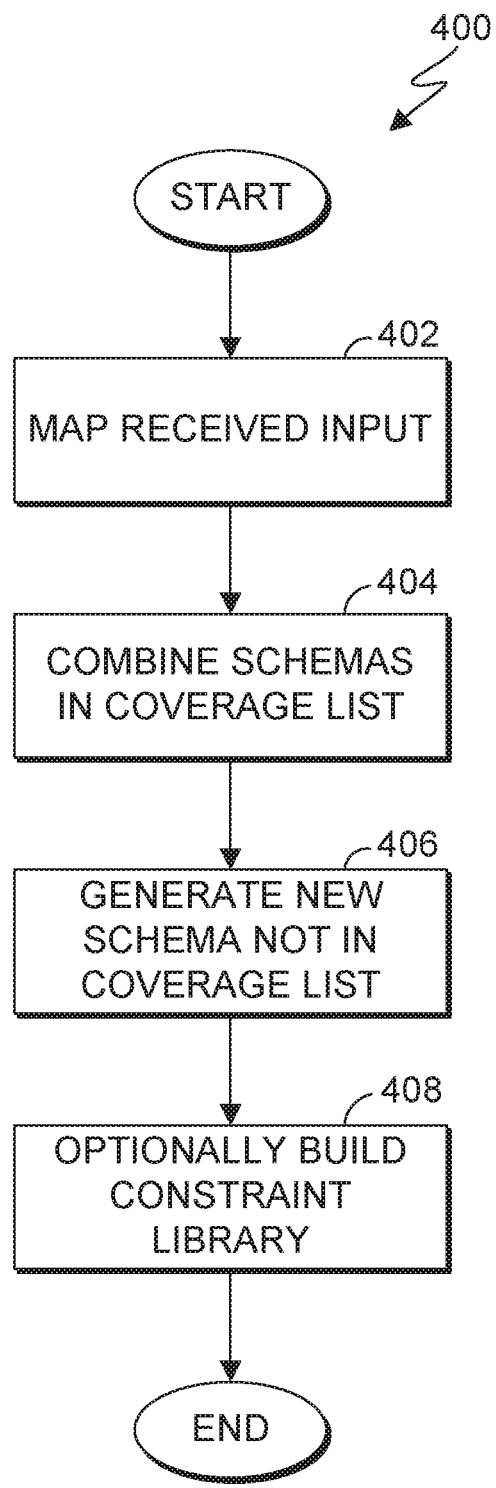
FIG. 4 is a flowchart illustrating operational steps for generating a schema, in accordance with an embodiment of the present invention.

FIG. 4 is a flowchart 400 illustrating operational steps for generating a schema, in accordance with an embodiment of the present invention. For example, the operational steps of flowchart 400 can be performed at step 304 of flowchart 300.

In step 402, schema solution generator module 108 maps received input. In this embodiment, schema solution generator module 108 maps received input by accessing constraint templates, constraints in the constraint library, and a coverage list and selecting templates and constraints that match the received input for the schema and specifies the constraints in a format which is recognized by constraint solver module 110.

In step 404, schema solution generator module 108 combines two or more schemas in the coverage list. For example, schema solution generator module 108 can generate the required event by a union, intersection, taking a cross-product of two schemas, etc. accessed from the coverage list in databases 118. Where templates and constraints do not accurately match the parameters of the received input, schema solution generator module 108 can derive the matching parameters by combining one or more templates and/or constraints.

In step 406, schema solution generator module 108 generates new schema not covered in the coverage list. In this embodiment, schema solution generator module 108 generates new schema not covered in the coverage list using machine learning techniques and the architecture knowledge base.

In step 408, schema solution generator module 108 optionally builds a constraint library for the newly generated schema. In this embodiment, schema solution generator module 108 builds a constraint library for the newly generated schema if the constraint library for the newly generated schema does not already exist.

Figure 5:
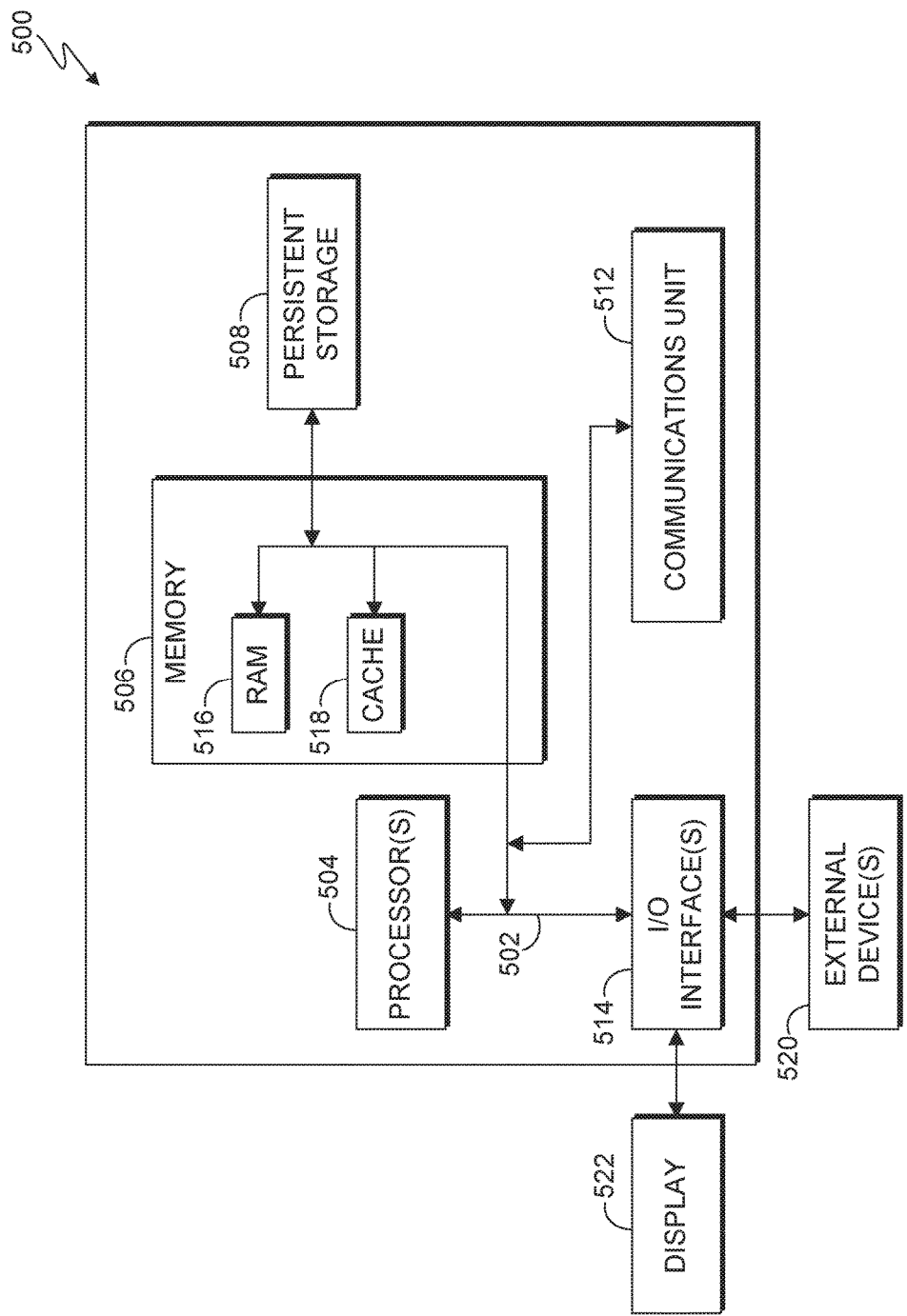
FIG. 5 is a block diagram of internal and external components of the computer systems of FIG. 1, in accordance with an embodiment of the present invention.

FIG. 5 is a block diagram of internal and external components of a computer system 500, which is representative the computer systems of FIG. 1, in accordance with an embodiment of the present invention. It should be appreciated that FIG. 5 provides only an illustration of one implementation and does not imply any limitations with regard to the environments in which different embodiments may be implemented. In general, the components illustrated in FIG. 5 are representative of any electronic device capable of executing machine-readable program instructions. Examples of computer systems, environments, and/or configurations that may be represented by the components illustrated in FIG. 5 include, but are not limited to, personal computer systems, server computer systems, thin clients, thick clients, laptop computer systems, tablet computer systems, cellular telephones (e.g., smart phones), multiprocessor systems, microprocessor-based systems, network PCs, minicomputer systems, mainframe computer systems, and distributed cloud computing environments that include any of the above systems or devices.

Computer system 500 includes communications fabric 502, which provides for communications between one or more processors 504, memory 506, persistent storage 508, communications unit 512, and one or more input/output (I/O) interfaces 514. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 516 and cache memory 518. In general, memory 506 can include any suitable volatile or non-volatile computer-readable storage media. Software is stored in persistent storage 508 for execution and/or access by one or more of the respective processors 504 via one or more memories of memory 506.

Persistent storage 508 may include, for example, a plurality of magnetic hard disk drives. Alternatively, or in addition to magnetic hard disk drives, persistent storage 508 can include one or more solid state hard drives, semiconductor storage devices, read-only memories (ROM), erasable programmable read-only memories (EPROM), flash memories, or any other computer-readable storage media that is capable of storing program instructions or digital information.

The media used by persistent storage 508 can also be removable. For example, a removable hard drive can be used for persistent storage 508. Other examples include optical and magnetic disks, thumb drives, and smart cards that are inserted into a drive for transfer onto another computer-readable storage medium that is also part of persistent storage 508.

Communications unit 512 provides for communications with other computer systems or devices via a network (e.g., network 114). In this exemplary embodiment, communications unit 512 includes network adapters or interfaces such as a TCP/IP adapter cards, wireless Wi-Fi interface cards, or 3G or 4G wireless interface cards or other wired or wireless communication links. The network can comprise, for example, copper wires, optical fibers, wireless transmission, routers, firewalls, switches, gateway computers and/or edge servers. Software and data used to practice embodiments of the present invention can be downloaded to computer system 102 through communications unit 512 (e.g., via the Internet, a local area network or other wide area network). From communications unit 512, the software and data can be loaded onto persistent storage 508.

One or more I/O interfaces 514 allow for input and output of data with other devices that may be connected to computer system 500. For example, I/O interface 514 can provide a connection to one or more external devices 520 such as a keyboard, computer mouse, touch screen, virtual keyboard, touch pad, pointing device, or other human interface devices. External devices 520 can also include portable computer-readable storage media such as, for example, thumb drives, portable optical or magnetic disks, and memory cards. I/O interface 514 also connects to display 522.

Display 522 provides a mechanism to display data to a user and can be, for example, a computer monitor. Display 522 can also be an incorporated display and may function as a touch screen, such as a built-in display of a tablet computer.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer system comprising:
one or more computer processors;
one or more non-transitory computer readable storage media; and
program instructions stored on the one or more non-transitory computer readable storage media for execution by at least one of the one or more computer processors, the program instructions comprising:
program instructions to receive a first request to generate a first test case, wherein the first request comprises a coverage schema associated with a first set of events to be covered in the generated first test case;
program instructions to update the coverage schema, wherein the program instructions to update the coverage schema comprise program instructions to add a second set of events to be covered in the generated first test case, wherein the second set of events is determined using machine learning techniques or by performing one of a union operation, an intersection operation, or a cross-product operation between at least two events of the first set of events;

program instructions to generate constraints used to satisfy requirements for meeting the first set of events and the second set of events in the updated coverage schema;

program instructions to, responsive to generating constraints used to satisfy requirements for meeting the first set of events and the second set of events in the updated coverage schema, add the generated constraints to a constraint library;

program instructions to generate the first test case using the generated constraints and the updated coverage schema;

program instructions to perform a test simulation to identify a passing test case;

program instructions to, responsive performing a test simulation to identify a passing test case, update a coverage database to reflect the identified passing test case;

program instructions to receive a second request to generate a second test case, wherein the second request comprises a coverage schema associated with a third set of events to be covered in the generated second test case;

program instructions to update the coverage schema, wherein the program instructions to update the coverage schema comprise program instructions to add a fourth set of events to be covered in the generated second test case, wherein the fourth set of events is determined using machine learning techniques or by performing one of a union operation, an intersection operation, or a cross-product operation between at least two events of the third set of events; and program instructions to, responsive to a failure obtained in executing the program instructions to generate constraints, transmit a notification to the constraint library to generate constraints for the second test case using machine learning techniques.

* * * * *